United States Patent
Wu et al.

(10) Patent No.: US 11,366,182 B2
(45) Date of Patent: Jun. 21, 2022

(54) MAGNETORESISTIVE DEVICES AND METHODS FOR FORMING THE SAME

(71) Applicant: Vanguard International Semiconductor Corporation, Hsinchu (TW)

(72) Inventors: Chien-Hsun Wu, Hsinchu (TW); Cheng-Ping Chang, Hualien (TW); Chien-Hui Li, Yilan (TW); Tai-I Yang, Hsinchu (TW); Yung-Hsiang Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 230 days.

(21) Appl. No.: 16/752,190

(22) Filed: Jan. 24, 2020

(65) Prior Publication Data
US 2021/0231753 A1  Jul. 29, 2021

(51) Int. Cl.
*G01R 33/09* (2006.01)
*H01L 43/02* (2006.01)
*H01L 43/08* (2006.01)
*H01L 43/12* (2006.01)

(52) U.S. Cl.
CPC ............ *G01R 33/091* (2013.01); *H01L 43/02* (2013.01); *H01L 43/08* (2013.01); *H01L 43/12* (2013.01)

(58) Field of Classification Search
CPC .. G01R 33/091; G01R 33/0082; G01R 33/09; H01L 43/12; H01L 43/08; H01L 43/02
See application file for complete search history.

(56) References Cited

U.S. PATENT DOCUMENTS

| | | | | |
|---|---|---|---|---|
| 6,020,738 A | * | 2/2000 | Van Den Berg | B82Y 25/00 324/252 |
| 8,476,129 B1 | * | 7/2013 | Jensen | H01L 24/13 438/200 |
| 8,644,057 B2 | * | 2/2014 | Kondo | G11C 11/1673 365/158 |
| 2003/0117254 A1 | * | 6/2003 | Wan | B82Y 25/00 338/32 R |
| 2004/0087037 A1 | * | 5/2004 | Berg | G01R 33/093 438/3 |
| 2005/0231856 A1 | * | 10/2005 | Kao | H01F 10/3263 360/324.11 |
| 2009/0016098 A1 | * | 1/2009 | Wunderlich | G01R 33/093 365/158 |

(Continued)

FOREIGN PATENT DOCUMENTS

TW   201705563 A   2/2017

OTHER PUBLICATIONS

Office Action of the corresponding TW patent application No. 108137375 dated Dec. 19, 2019.

*Primary Examiner* — Christopher P McAndrew
*Assistant Examiner* — Zannatul Ferdous
(74) *Attorney, Agent, or Firm* — Birch, Stewart, Kolasch & Birch, LLP

(57) ABSTRACT

A magnetoresistive device includes a magnetoresistor disposed over a substrate, a stress release structure covering a side surface of the magnetoresistor, an electrical connection structure disposed over the magnetoresistor, and a passivation layer disposed over the electrical connection structure and the stress release structure.

19 Claims, 21 Drawing Sheets

(56) References Cited

U.S. PATENT DOCUMENTS

| | | | | |
|---|---|---|---|---|
| 2012/0187360 A1* | 7/2012 | Eungyoon | ............. | G11C 11/161 257/2 |
| 2013/0244344 A1* | 9/2013 | Malmhall | .............. | B82Y 10/00 438/3 |
| 2017/0110404 A1* | 4/2017 | Guan | ................ | H01L 29/41766 |
| 2018/0182810 A1* | 6/2018 | Yi | ........................... | H01L 43/08 |

* cited by examiner

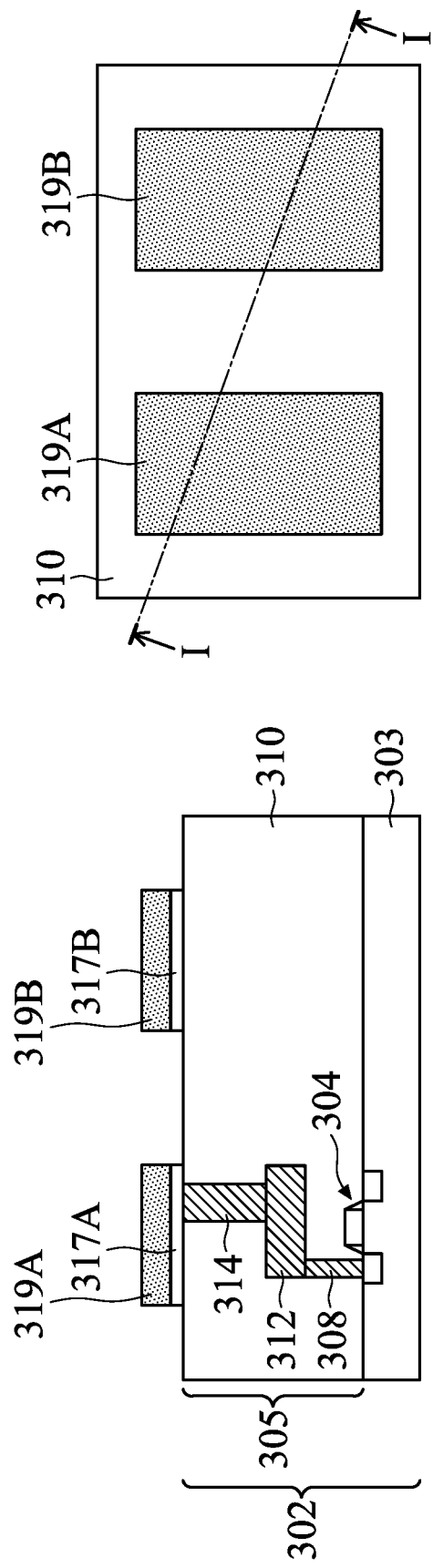

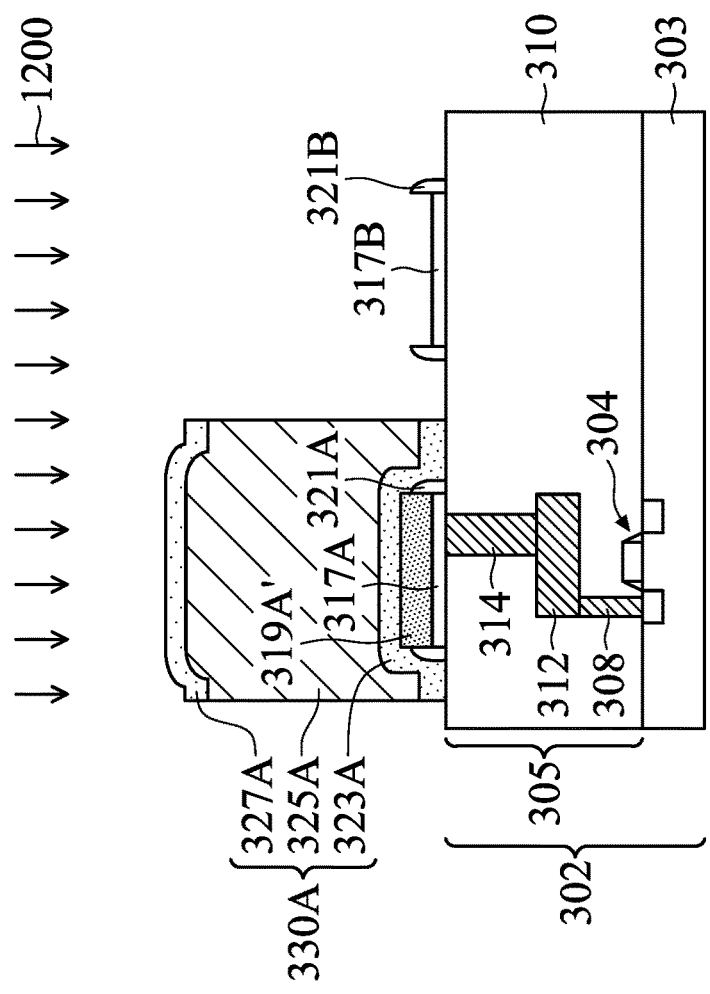
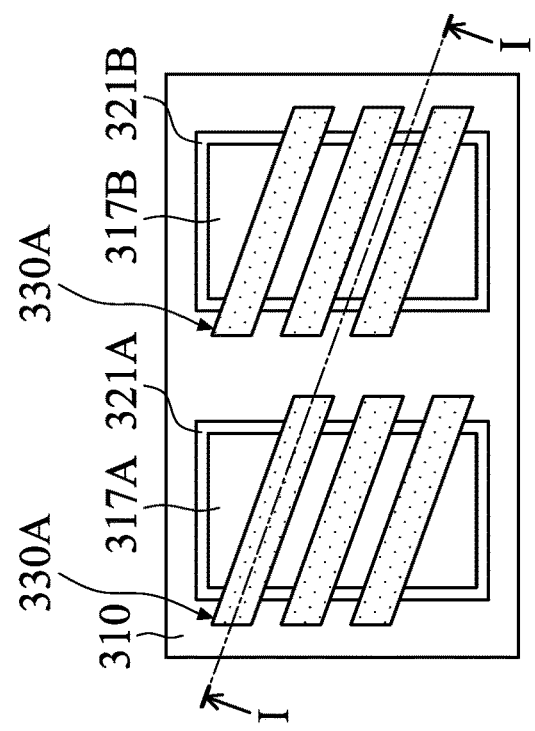
FIG. 3H-1
FIG. 3H-2

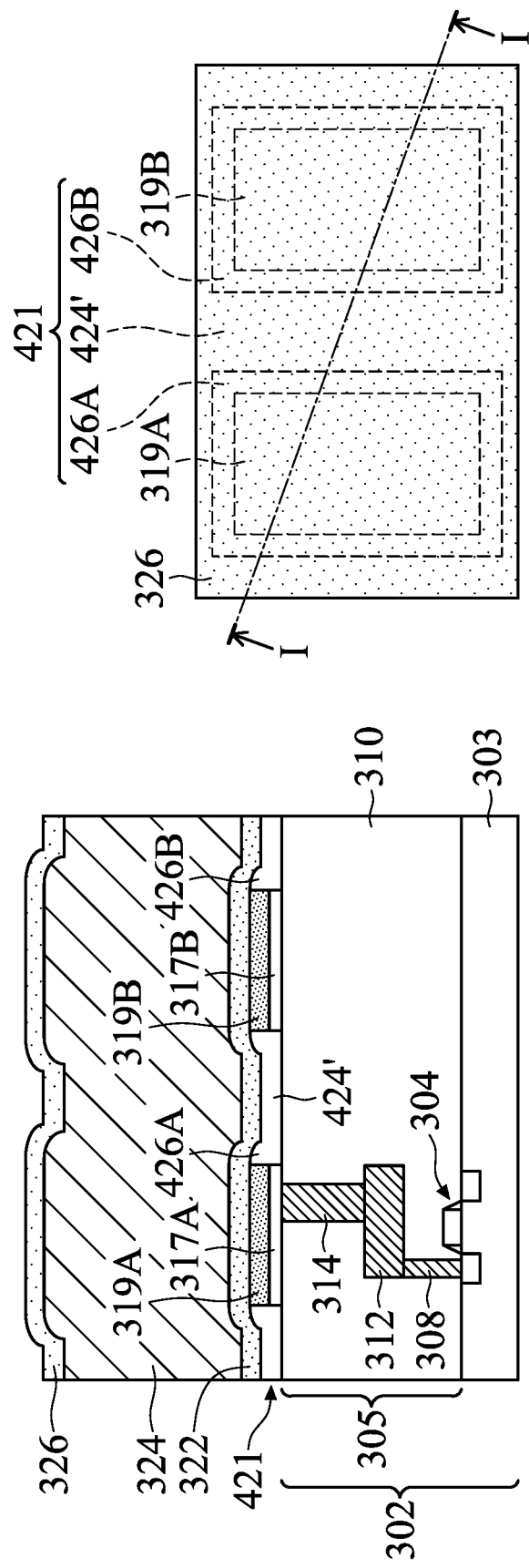

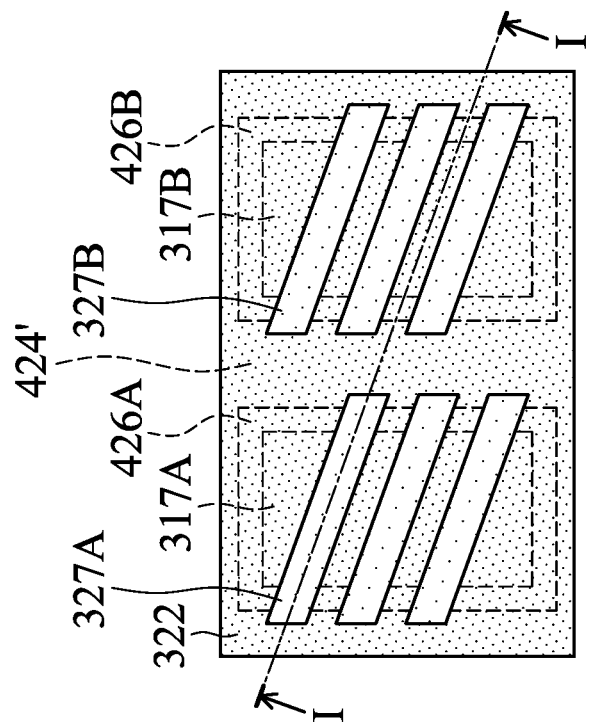
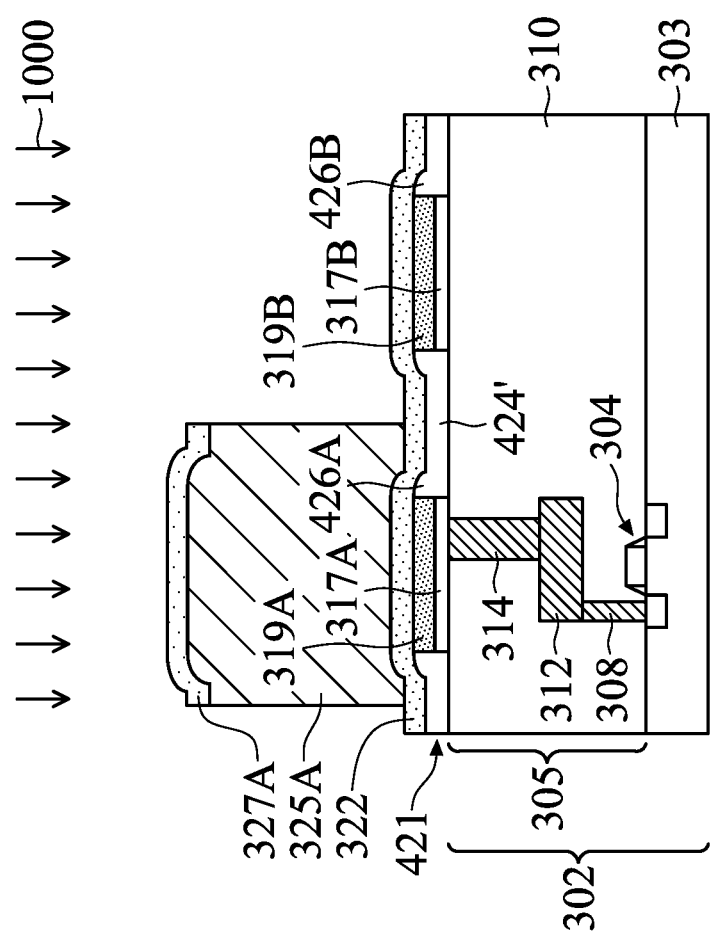
FIG. 4F-2
FIG. 4F-1

MAGNETORESISTIVE DEVICES AND METHODS FOR FORMING THE SAME

BACKGROUND

Technical Field

The disclosure relates to magnetoresistive devices, and magnetoresistive devices including a stress release structure.

Description of the Related Art

In recent years, magnetoresistive devices have been widely used in various electronic products such as personal computers, mobile phones, and digital cameras. Magnetoresistive devices include magnetoresistors formed by magnetoresistive materials, and the magnetic moment orientations of the magnetoresistors can vary based on applied magnetic fields thereby changing the resistance of the magnetoresistors. Common magnetoresistors include the anisotropic magnetoresistor (AMR), the giant magnetoresistor (GMR), and the tunneling magnetoresistor (TMR). For example, the magnetic moment orientation of an anisotropic magnetoresistor (AMR) is generally parallel to its length direction; the magnetoresistor has a maximum resistance when the magnetic moment orientation of the magnetoresistor is parallel to the direction of the current flowing through the magnetoresistor; the magnetoresistor has a minimum resistance when the magnetic moment orientation of the magnetoresistor is perpendicular to the direction of the current flowing through the magnetoresistor.

For example, a magnetoresistive device including an AMR is generally in electrical connection with wires of conductive structures which are formed on the AMR. For applications that sense direction and the value of magnetic fields, the conductive structures are formed on an AMR with a barber pole (BBP)-like pattern. One ideal design is to design it so that the direction of the current flowing through the AMR between the BBP conductive structures has the shortest distance between the BBP conductive structures. One common design has the length direction of the BBP conductive structure intersect the length direction of the AMR at an angle of 45 degrees so there is a linear relation between the resistance of the magnetoresistor 104 and the change of the applied magnetic field.

In the existing manufacturing process of magnetoresistive devices, the process for forming conductive structures still faces various challenges, particularly in reducing the damage to the magnetoresistor, and thus methods for forming magnetoresistive devices still need further improvements.

SUMMARY

Some embodiments of the present disclosure provide a magnetoresistive device. The magnetoresistive device includes a magnetoresistor disposed over a substrate, a stress release structure covering a side surface of the magnetoresistor, an electrical connection structure disposed over the magnetoresistor, and a passivation layer disposed over the electrical connection structure and the stress release structure.

Some embodiments of the present disclosure provide a method for forming a magnetoresistive device. The method includes forming a magnetoresistor over a substrate, forming a dielectric material over the magnetoresistor, etching the dielectric material to form a stress release structure surrounding a side surface of the magnetoresistor, forming an electrical connection structure over the magnetoresistor, and forming a passivation layer covering the electrical connection structure and the stress release structure.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein:

FIGS. 3A-1 to 3I-1 and 3A-2 to 3I-2 illustrate diagrammatic views of forming a magnetoresistive device including a stress release structure in accordance with some embodiments of the present disclosure;

FIGS. 4A-1 to 4H-1 and 4A-2 to 4H-2 illustrate diagrammatic views of forming a magnetoresistive device including a stress release structure in accordance with some embodiments of the present disclosure.

DETAILED DESCRIPTION

Figure 1B:
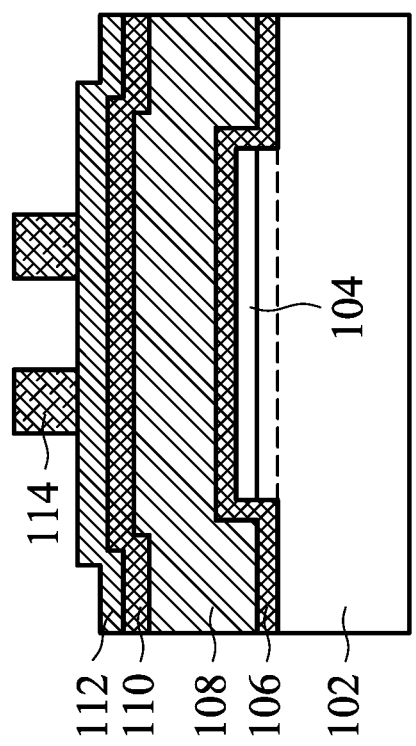
FIGS. 1A-1D illustrate cross-sectional views of forming a magnetoresistive device at intermediate steps in accordance with some examples.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1A:
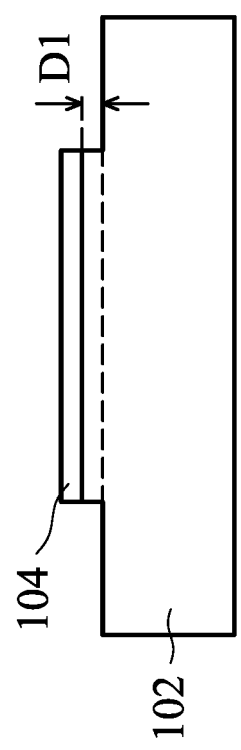
Figure 1C:
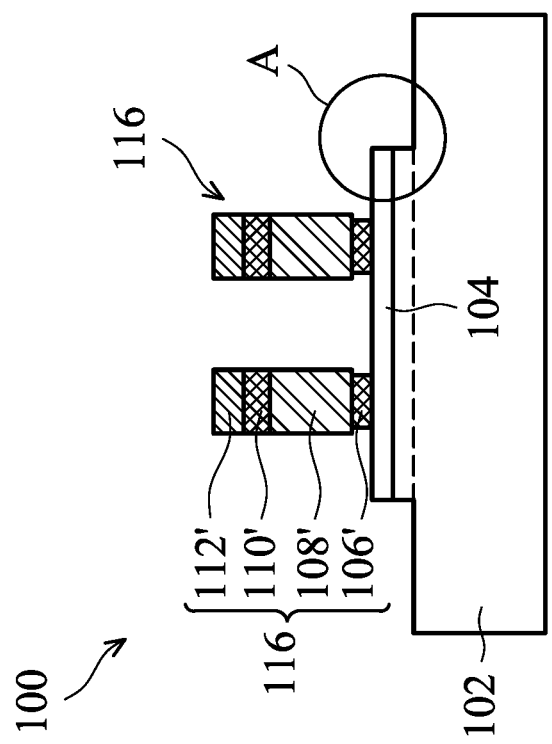
Figure 1D:
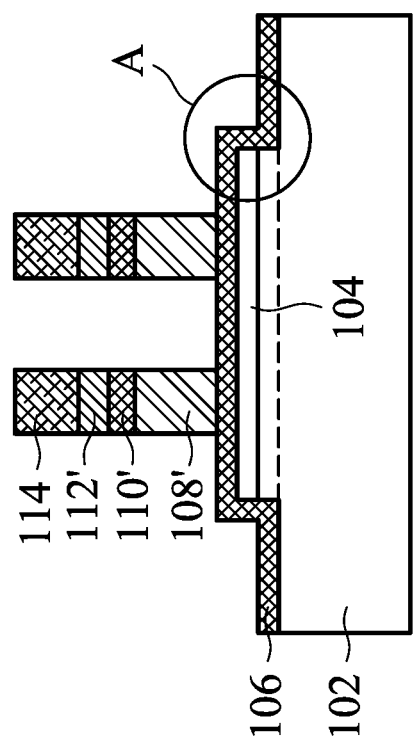

FIGS. 1A-1D illustrate cross-sectional views of forming a magnetoresistive device 100 shown in FIG. 1D at intermediate steps in accordance with some examples.

Referring to FIG. 1D, the magnetoresistive device 100 includes a substrate 102, magnetoresistor 104 and electrical connection structures 116. The substrate 102 may include active elements (such as logic circuits) and an interconnect structure over the active elements. The interconnect structure may include dielectric layers (such as interlayer dielectric layers and intermetal dielectric layers) and conductive features (such as contacts, vias and/or conductive lines) to electrically connect the active elements to the magnetoresistor 104. The electrical connection structures 116 are disposed over the magnetoresistor 104 and configured to change the direction of a current flowing through the magnetoresistor 104 between the electrical connection structures 116 so there is a linear relation between the resistance of the magnetoresistor 104 and the change of the applied magnetic field The electrical connection structures 116 include a lower barrier layer 106', a metal bulk layer 108', an upper barrier layer 110' and an anti-reflective coating (ARC) layer 112' sequentially stacked over the magnetoresistor 104. The method for forming the magnetoresistive device 100 shown in FIG. 1D is described in detail below.

Referring to FIG. 1A, a substrate 102 is provided, and a magnetoresistive material such as nickel iron (NiFe), cobalt iron (CoFe), cobalt iron boron (CoFeB), platinum manganese (PtMn), ruthenium (Ru), lanthanum manganese (IrMn), copper (Cu), and/or tantalum (Ta) is formed over the substrate 102. Next, the magnetoresistive material is patterned to form a magnetoresistor 104, such as an anisotropic magnetoresistor (AMR) or a giant magnetoresistor (GMR). The patterning process includes a photolithography process and a dry etching process. The dry etching process generally over-etches a dielectric layer of the substrate 102 to a depth D1, such as in a range from about 500 Å to about 1000 Å, to form a height difference. Referring to FIG. 1B, a first barrier material 106 (such as titanium tungsten (TiW)), a metal bulk material 108 (such as aluminum copper (AlCu) alloy), a second barrier material (such as titanium nitride 110 (TiN)), and an anti-reflective coating layer 112 are sequentially formed over the substrate 102. A patterning process is then performed. The patterning process includes forming a patterned photoresist layer 114 over the anti-reflective coating layer 112, as shown in FIG. 1B. The patterning process also includes performing a dry etching process on the anti-reflective coating layer 112, the second barrier material 110 and the metal bulk material 108 to form patterned anti-reflective coating layers 112', patterned upper barrier layers 110' and patterned metal bulk layers 108' respectively, as shown in FIG. 1C. The first barrier material 106 is used as an etching stop layer to protect the underlying magnetoresistor 104 from damage due to dry etching. The patterning process also includes removing the patterned photoresist layer 114 using an ashing process. Next, referring to FIG. 1D, portions of the first barrier material 106 uncovered by the metal bulk layers 108' are removed using a wet etching process to form lower barrier layers 106'.

It should be noted that an adhesive force between the first barrier material 106 and the magnetoresistor 104 is greater than an adhesive force between the magnetoresistor 104 and the dielectric layer of the substrate 102. Thus, during the ashing of the photoresist layer 114 (FIG. 1C), a deformation stress that the first barrier material 106 generates due to high temperatures is prone to be released from an edge of the pattern of the magnetoresistor 104 (such as region A) in a way of a local cracking so that the pattern of the magnetoresistor 104 adhering to the local-cracked first barrier material layer 106 becomes separated from the dielectric layer of the substrate 102 at the pattern edge. As a result, during the wet etching process for removing the first barrier material 106 (FIG. 1D), the pattern of the magnetoresistor 104 is locally peeled off from its edge (such as in region A) thereby reducing the manufacturing yield of the magnetoresistive device and impacting the reliability of the magnetoresistive device.

Figure 2:
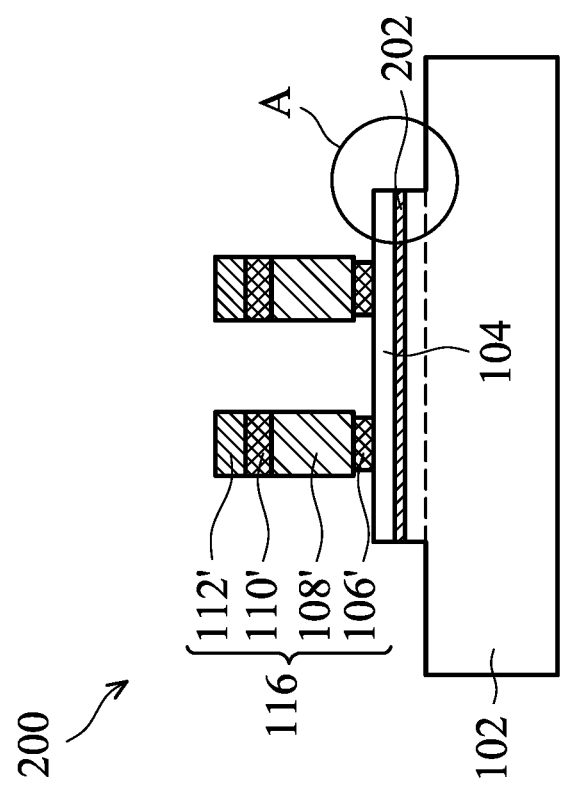
FIG. 2 illustrates a cross-sectional view of a magnetoresistive device in accordance with some other examples.

FIG. 2 is a cross-sectional view of a magnetoresistive device 200 in accordance with some other example. Elements or layers in FIG. 2 that are the same or similar to those in FIGS. 1A-1D are denoted by like reference numerals that have the same meaning, and the description thereof will not be repeated for the sake of brevity. The difference between the examples shown in FIG. 2 and FIGS. 1A-1D is that the magnetoresistive device 200 includes a tantalum (Ta)-containing adhesion layer 202. The adhesion layer 202 is disposed between the magnetoresistor 104 and the substrate 102 and configured to increase an adhesive force between the magnetoresistor 104 and the dielectric layer of the substrate 102, which may prevent the first barrier material 106 from being peeled off from the edge of the pattern of magnetoresistor 104. Thus, the peeling problem of the pattern of the magnetoresistor 104 at the edge may be solved.

However, in the example of FIG. 2, if tantalum atoms from the adhesion layer 202 diffuse into the magnetoresistor 104, the magnetoresistance ratio (MR %) of the magnetoresistor 104 may be decreased. Thus, the process temperatures after the formations of the adhesion layer 202 and the magnetoresistor 104 are limited to below 300° C. In the examples shown in FIGS. 1A-1D, the process temperature of chemical vapor deposition (CVD) for forming the anti-reflective coating layer 112 ranges from about 300° C. to about 400° C., while in the example shown in FIG. 2, the process temperature of CVD for forming the anti-reflective coating layer 112 is limit to a range from about 250° C. to about 300° C. The CVD performed at a low temperature has a lower deposition rate and poor thickness uniformity and more undesirable particle performance, all of which may reduce the manufacturing efficiency and production yield of the magnetoresistive device 200. Furthermore, limiting the process temperature to below 300° C. causes the magnetoresistor 104 to fail to perform a subsequent high-temperature annealing process to enhance the magnetoresistance ratio (MR %).

Figures 1, 2, 3A:
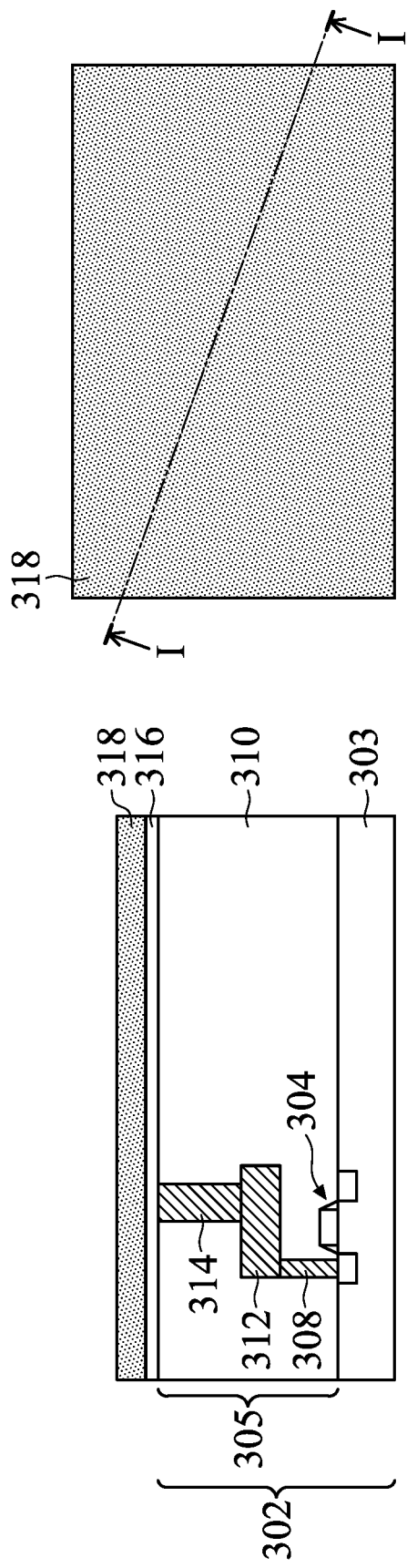
Figures 1, 2, 3C:
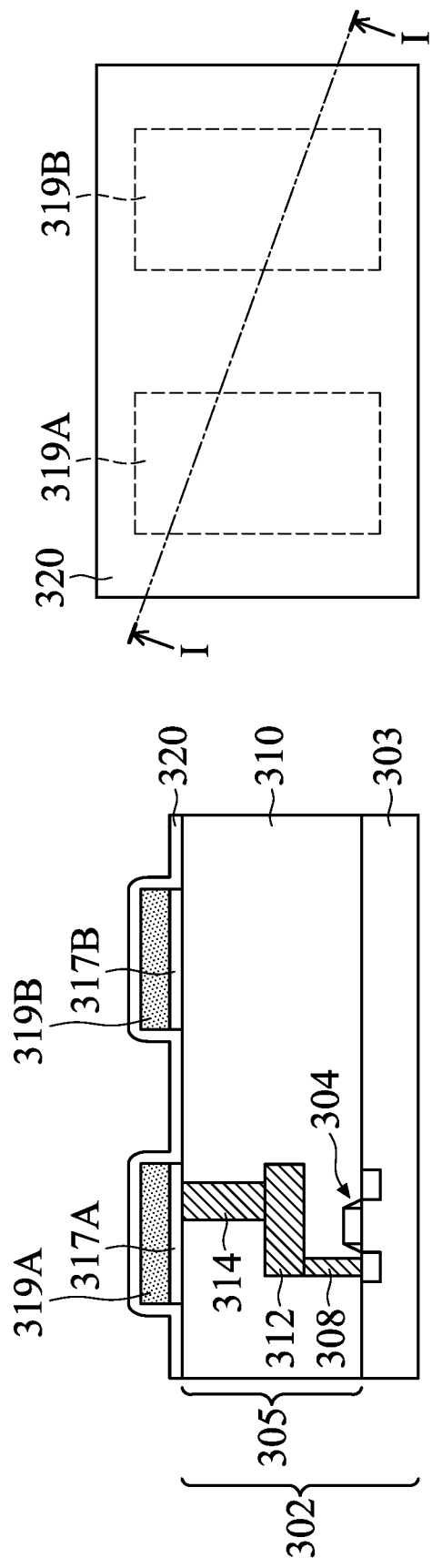
Figures 1, 2, 3D:
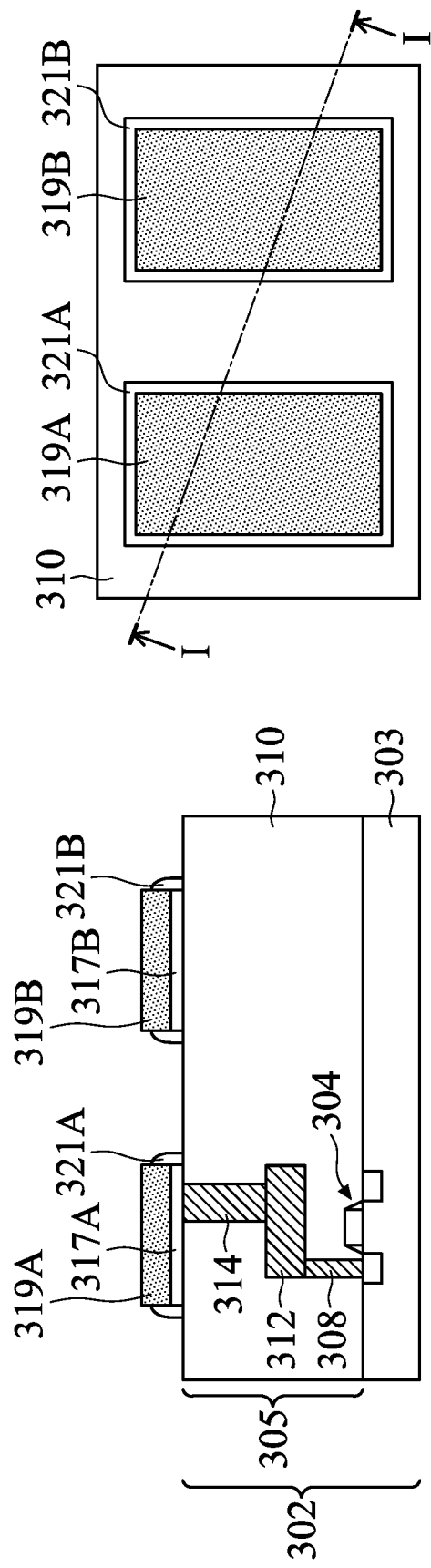
Figures 1, 2, 3E:
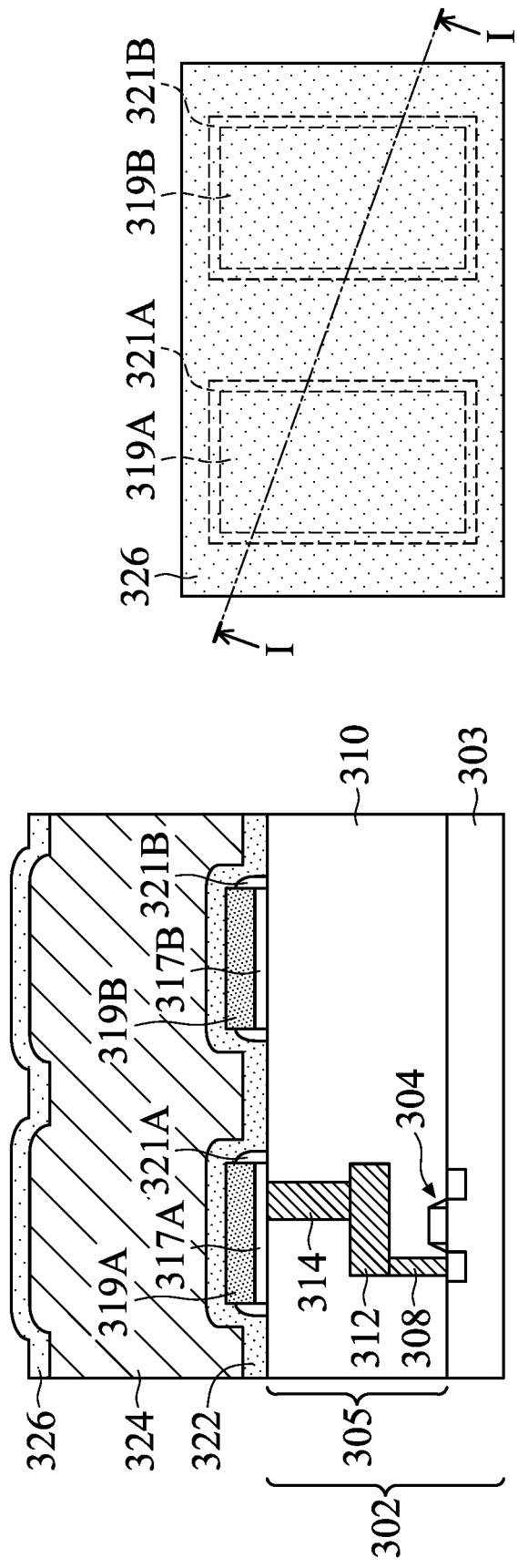
Figures 1, 2, 3F:
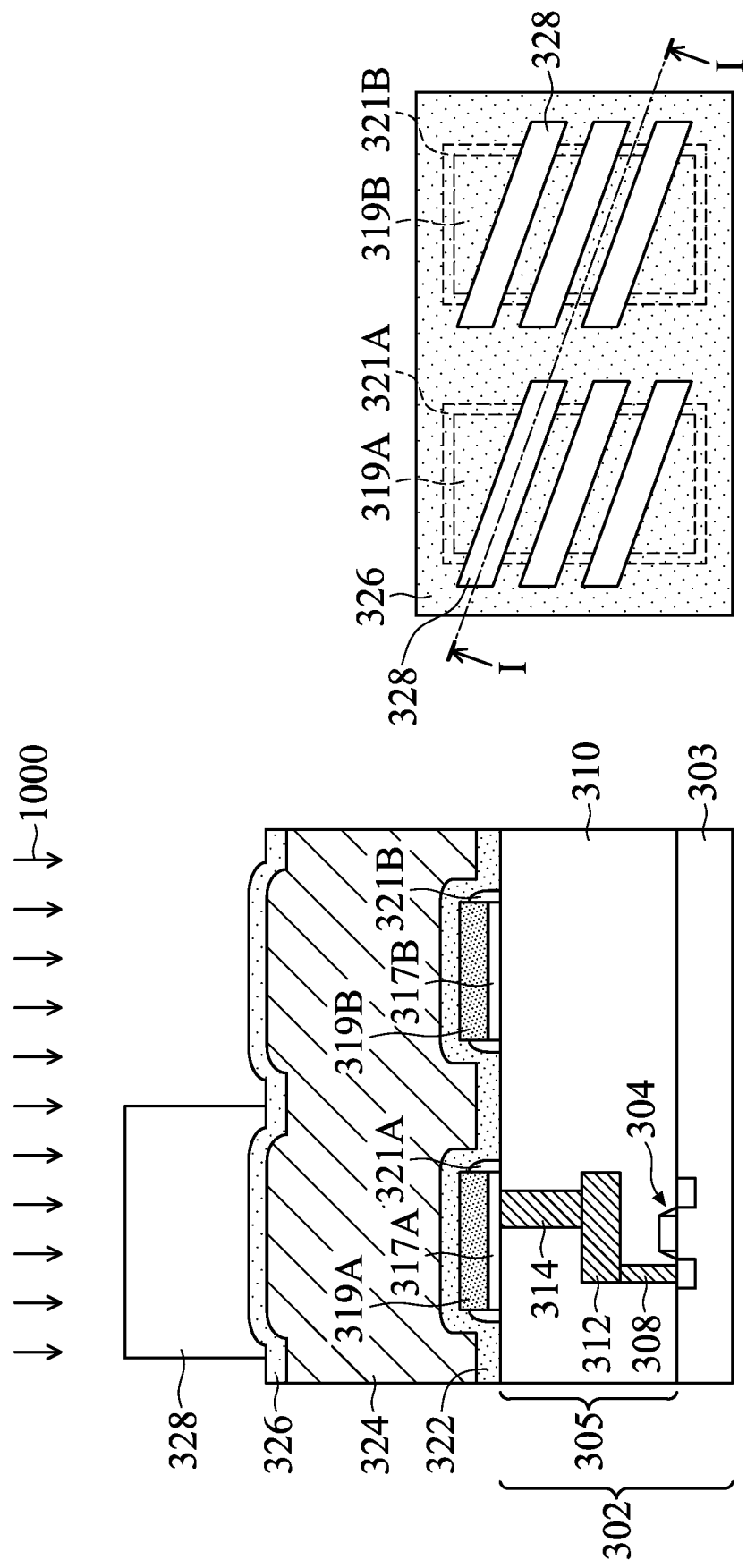
Figures 1, 2, 3G:
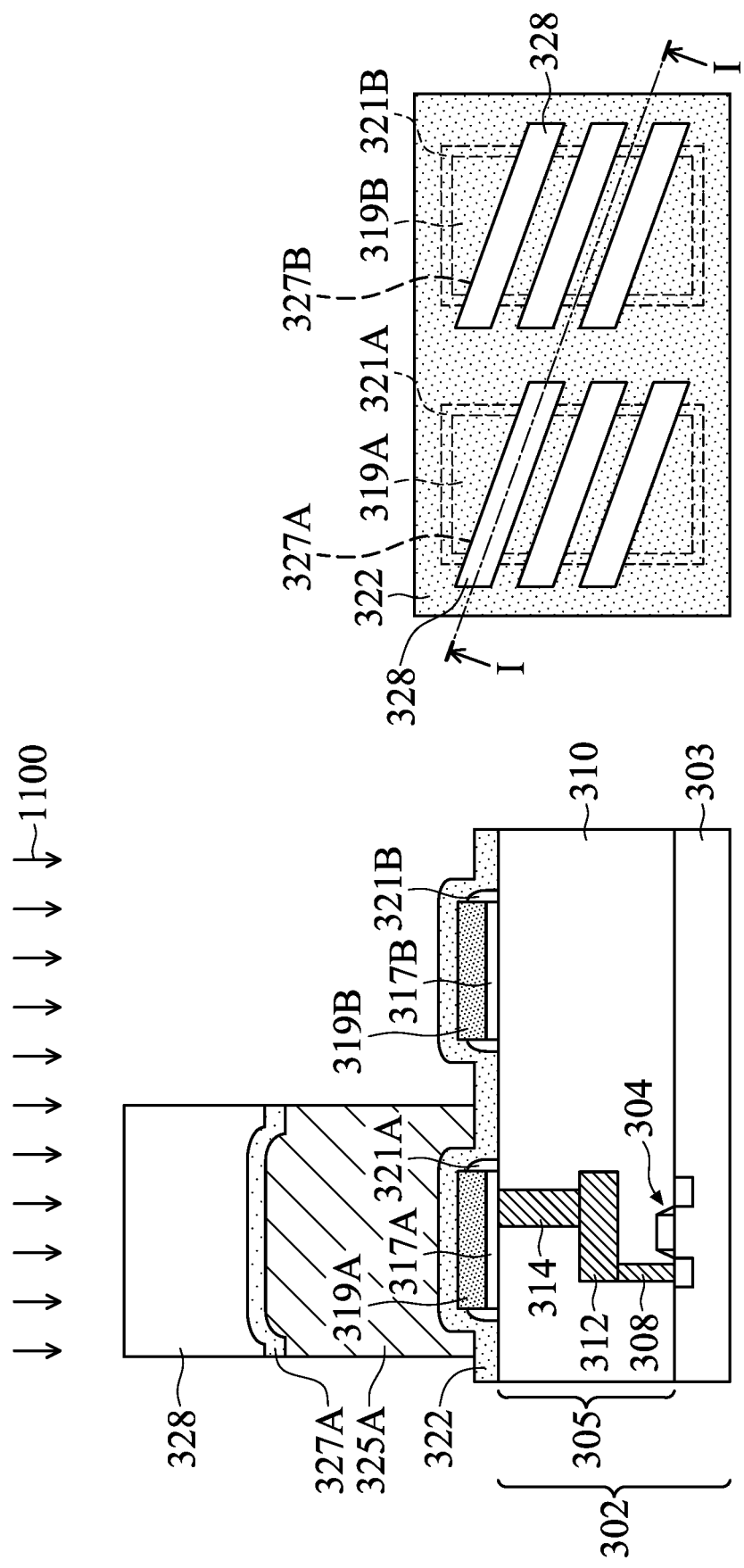
Figures 1, 2, 3I:
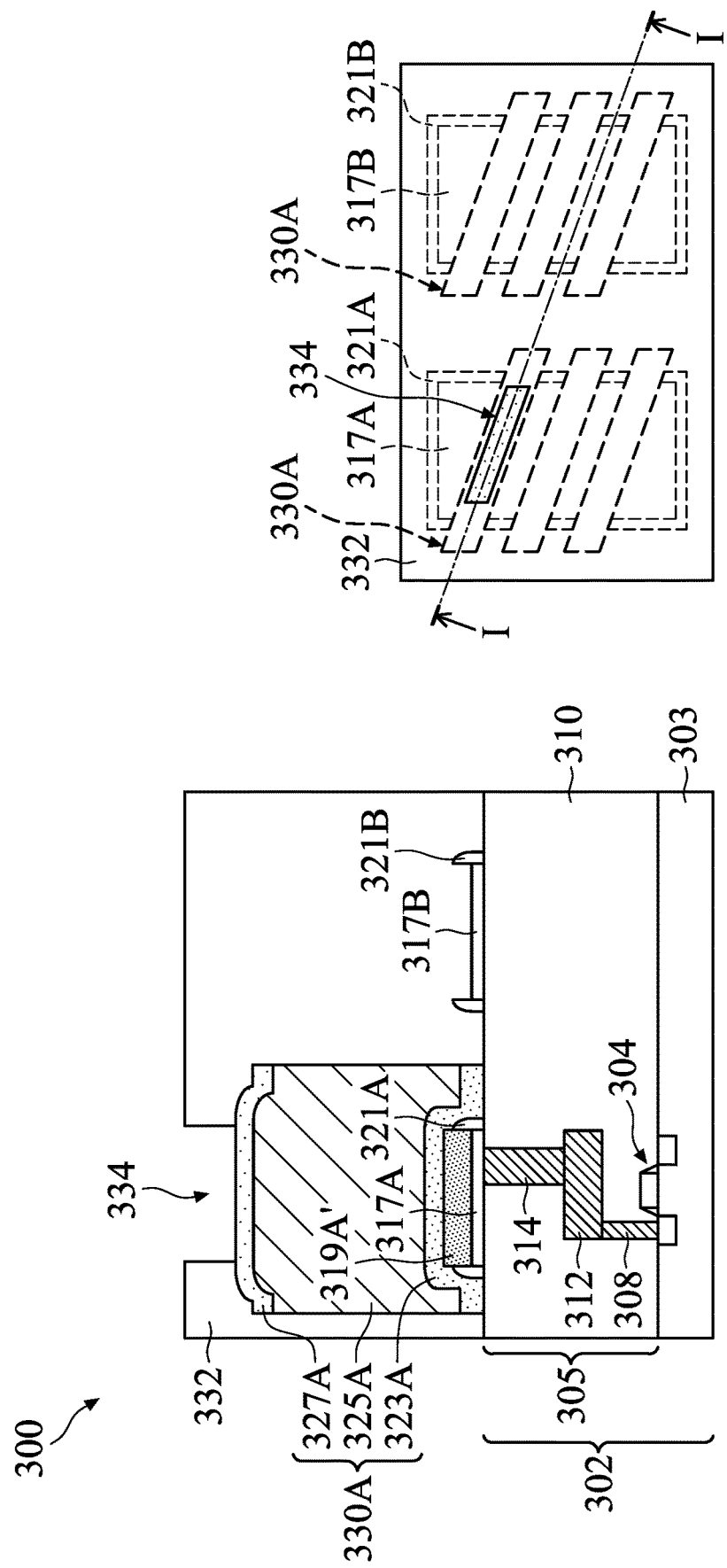

FIGS. 3A-1 to 3I-1 illustrate cross-sectional views of forming a magnetoresistive device including a stress release structure at intermediate steps in accordance with some embodiments of the present disclosure and FIGS. 3A-2 to 3I-2 illustrate top views of forming the magnetoresistive device at intermediate steps in accordance with some embodiments of the present disclosure, wherein FIGS. 3A-1 to 3I-1 are cross-sectional views taken along line I-I shown in FIGS. 3A-2 to 3I-2 respectively. In some embodiments, the stress applied to a magnetoresistor can be released by forming a stress release structure covering a side surface of the magnetoresistor without using a Ta-containing adhesion layer. As a result, cracks in the pattern of the magnetoresistor at the edge can be prevented from forming. This, in turn, prevents the pattern of the magnetoresistor from peeling off of the edge.

A substrate 302 is provided, as shown in FIG. 3A-1, in accordance with some embodiments. In some embodiments, the substrate 302 includes a semiconductor substrate 303, an active element 304 disposed on the semiconductor substrate 303, and a multilayer interconnect structure 305. In some embodiments, the substrate 302 may be a silicon substrate, a silicon germanium (SiGe) substrate, a compound semiconductor substrate, a silicon-on-insulator (SOI) substrate, or the like. In some embodiments, the active element 304 is a logic circuit such as a transistor. In some embodiments, the multilayer interconnect structure 305 includes a dielectric layer 310, such as intermetal dielectric (IMD) layer and/or interlayer dielectric layer (ILD) and conductive features surrounded by the dielectric layer 310, such as a contact 308 and/or a vias 314 providing vertical electrically routing and a conductive line 312 providing horizontal electrically routing.

A magnetoresistive material 316 is formed over the dielectric layer 310 of the substrate 302, as shown in FIG. 3A-1, in accordance with some embodiments. In some embodiments, the magnetoresistive material 316 includes or is nickel iron (NiFe), cobalt iron (CoFe), cobalt iron boron (CoFeB), copper (Cu), platinum manganese (PtMn), iridium manganese (IrMn), ruthenium (Ru), the like, multilayers thereof, a combination thereof, or other materials suitable for constituting an AMR or GMR stacked structure. In some embodiments, the magnetoresistive material 316 is formed using CVD, physical vapor deposition (PVD), atomic layer deposition (ALD), another suitable deposition technique, or a combination thereof. In some embodiments, no tantalum-containing material is formed between the dielectric layer 310 and the magnetoresistive material layer 316.

A protection material 318 is formed over the magnetoresistive material 316, as shown in FIGS. 3A-1 and 3A-2, in accordance with some embodiments. In some embodiments, the protection material 318 includes or is titanium tungsten (TiW), titanium (Ti), titanium nitride (TiN), the like, or a combination thereof. In some embodiments, the protection material 318 is formed using PVD, ALD, another suitable deposition technique, or a combination thereof. In some embodiments, the protection material 318 has a thickness in a range from about 300 Å to about 1500 Å. In an embodiment, the protection material 318 is made of TiW with a weight ratio of Ti to W about 1:9.

A patterning process is performed on the protection material 318 and the magnetoresistive material 316 to form protection layers 319, 319B and magnetoresistors 317A, 317B respectively, as shown in FIGS. 3B-1 and 3B-2, in accordance with some embodiments. Side surfaces of the protection layer 319A are aligned over side surfaces of the magnetoresistor 317A, and side surfaces of the protection layer 319B are aligned over side surfaces of the magnetoresistor 317B, in accordance with some embodiments. In some embodiments, the patterning process includes a photolithography process and an etching process. For example, mask elements (such as photoresist) are formed over the protection material 318 (FIG. 3A-1) and then portions of the protection material 318 and the magnetoresistive material 316 uncovered by the mask elements are etched away until the dielectric layer 310 of the substrate 302 is exposed. The etching process may be dry etching such as ion beam etch (IBE), reactive ion etch (RIE), or another suitable etching technique. The multilayer interconnect structure 305 couples the active element 304 to the magnetoresistor 317A and/or magnetoresistor 317B, and/or electrical connection structures (not shown) formed under the magnetoresistors 317A, 317B, in accordance with some embodiments.

A dielectric material 320 is conformally formed over the substrate 302, the magnetoresistors 317A, 317B and the protection layers 319A, 319B, as shown in FIGS. 3C-1 and 3C-2, in accordance with some embodiments. The dielectric material 320 laterally extends along the upper surface of the dielectric layer 310, the side surfaces of the magnetoresistors 317A, 317B, and the side surfaces and the upper surfaces of the protection layers 319A, 319B, in accordance with some embodiments. In some embodiments, the dielectric material 320 includes or is silicon oxide, silicon nitride, silicon oxynitride, a combination thereof, or another suitable dielectric material. In some embodiments, the dielectric material 320 is formed using CVD (such as low-temperature CVD), PVD, ALD, or another suitable deposition technique. In some embodiments, the dielectric material 320 has a thickness ranging from about 500 to Å about 5000 Å.

An etching process is performed on the dielectric material 320 until the upper surfaces of the protection layers 319A, 319B and the upper surface of the dielectric layer 310 are exposed, as shown in FIGS. 3D-1 and 3D-2, in accordance with some embodiments. The etching process may be dry etching such as IBE, RIE, or another suitable etching technique. In some embodiments, the etching process is a mask-free etching process. That is, during the etching process, no mask element is formed over the dielectric material 320.

After the etching process, remaining portions of the dielectric material 320 form stress release structures 321A, 321B, in accordance with some embodiments. The stress release structures 321A, 321B each laterally extend in a closed loop to surround the side surfaces of the magnetoresistors 317A, 317B, respectively, in accordance with some embodiments. The stress release structures 321A, 321B entirely cover the side surfaces of the magnetoresistors 317A, 317B, in accordance with some embodiments. That is, the stress release structures 321A, 321B upwardly extend beyond the upper surfaces of the magnetoresistors 317A, 317B to cover at least partially the side surfaces of the protection layers 319A, 319B, in accordance with some embodiments. Inner side surfaces of the stress release structures 321A, 321B facing the magnetoresistors 317A, 317B abut the magnetoresistors 317A, 317B and the protection layers 319A, 319B, in accordance with some embodiments.

The stress release structures 321A, 321B are configured to transfer the stress that is applied to the magnetoresistors 317A, 317B from the material layers above the magnetoresistors 317A, 317B (such as the protection layers 319A, 319B and subsequently formed material layers) to themselves so that the stress applied to the magnetoresistors 317A, 317B may be released, in accordance with some embodiments. As a result, by forming a stress release structure covering the interface between the magnetoresistor and the protection at the edge, the pattern of the magnetoresistor can be prevented from cracking at the edge, which in turn prevents peeling.

A first barrier material 322 is formed over the substrate 302, the stress release structures 321A, 321B, and the protection layers 319A, 319B, as shown in FIG. 3E-1, in accordance with some embodiments. The first barrier material 322 conformally extends along the upper surface of the dielectric layer 310, the outer side surfaces of the stress release structures 321A, 321B, and the upper surfaces (and the side surfaces if exposed) of the protection layers 319A, 319B. In some embodiments, the first barrier material 322 includes or is titanium tungsten (TiW), titanium nitride (TiN), titanium (Ti), tantalum nitride (TaN), tantalum (Ta), a combination thereof, or another suitable barrier material. In some embodiments, the first barrier material 322 is formed using PVD, ALD, or another suitable deposition technique. In some embodiments, the first barrier material 322 has a thickness ranging from about 250 Å to about 750 Å.

A metal bulk material 324 is formed over the first barrier material 322, as shown in FIG. 3E-1, in accordance with some embodiments. In some embodiments, the metal bulk material 324 includes or be aluminum copper (AlCu), aluminum silicon copper (AlSiCu), a combination thereof, or another suitable metal material. In some embodiments, the metal bulk material 324 is formed using PVD, ALD, electroplating, or another suitable deposition technique. In some embodiments, the metal bulk material 324 has a thickness ranging from about 3000 Å to about 8000 Å.

A second barrier material 326 is formed over the metal bulk material 324, as shown in FIGS. 3E-1 and 3E-2, in accordance with some embodiments. In some embodiments, the second barrier material 326 includes or is titanium nitride (TiN), titanium (Ti), tantalum nitride (TaN), tantalum (Ta), a combination thereof, or another suitable barrier material. In some embodiments, the second barrier material 326 is formed using PVD, ALD, or another suitable deposition technique. In some embodiments, the second barrier material 326 has a thickness ranging from about 250 Å to about 500 Å.

A patterning process 1000 is performed on the second barrier material 326 and the metal bulk material 324, in accordance with some embodiments. The patterning process 1000 includes a photolithography process in which mask elements 328 (such as photoresist) are formed over the upper surface of the second barrier material 326, as shown in FIGS. 3F-1 and 3F-2. The patterns of the mask elements 328 correspond to patterns of electrical connection structures sequentially formed over the magnetoresistors 317A, 317B. In some embodiments, an anti-reflective coating layer may be formed over the upper surface of the second barrier material 326 before forming the mask elements 328.

The patterning process 1000 also includes performing an etching process 1100 on the second barrier material 326 and the metal bulk material 324 until the upper surface of the first barrier material 322 is exposed, as shown in FIGS. 3G-1 and 3G-2, in accordance with some embodiments. The first barrier material 322 is used as an etching stop layer during the etching process to protect the underlying magnetoresistors 317A, 317B from the damage due to the etching process, in accordance with some embodiments. In some embodiments, the etching process 1100 is dry etching such as IBE, RIE, and another suitable etching technique.

The etching process 1100 removes portions of the second barrier material 326 and the metal bulk material 324 uncovered by the mask elements 328 thereby transferring the patterns of the mask elements 328 into the second barrier material 326 and the metal bulk material 324, in accordance with some embodiments. Remaining portions of the second barrier material 326 and remaining portions of the metal bulk material 324 are referred to as upper barrier layers 327A, 327B and metal bulk layer 325A, 325B respectively, wherein the metal bulk layer 325B is not shown in FIGS. 3G-1 and 3G-2, in accordance with some embodiments. The upper barrier layer 327A along with the metal bulk layer 325A corresponds to the magnetoresistor 317A, and the upper barrier layer 327B along with the metal bulk layer 325B corresponds to the magnetoresistor 317B, in accordance with some embodiments. The upper barrier layer 327A is aligned over the metal bulk layer 325A, and the upper barrier layer 327B is aligned over the metal bulk layer 325B, in accordance with some embodiments.

The patterning process 1000 also includes performing an ashing process to remove the mask elements 328 (such as photoresist) thereby exposing the upper barrier layers 327A, 327B, in accordance with some embodiments.

A wet etching process 1200 is performed on the first barrier material 322 and the protection layers 319A, 319B using the metal bulk layers 325A, 325B as etching masks until the upper surfaces of the magnetoresistors 317A, 317B and the upper surface of the dielectric layer 310 are exposed, as shown in FIGS. 3H-1 and 3H-2, in accordance with some embodiments. The inner side surfaces of the stress release structures 321A, 321B facing the magnetoresistors 317A, 317B are also partially exposed, in accordance with some embodiments. The wet etching process uses a hydrogen peroxide ($H_2O_2$)-containing solution, which prevents damage to the magnetoresistors 317A, 317B, in accordance with some embodiments.

The wet etching process removes portions of the first barrier material 322 and the protection layers 319A, 319B uncovered by the metal bulk layers 325A, 325B, in accordance with some embodiments. Remaining portions of the first barrier material 322 are referred to as lower barrier layers 323A, 323B, and remaining portions of the protection layers 319A, 319B are referred to as protection layers 319A', 319B', wherein the lower barrier layer 323B and the protection layer 319B' are not shown in FIGS. 3H-1 and 3H-2, in accordance with some embodiments. The lower barrier layer 323A is aligned below the metal bulk layer 325A, and the lower barrier layer 323B is aligned below the metal bulk layer 325B, in accordance with some embodiments. The upper barrier layers 327A, the metal bulk layers 325A and the lower barrier layers 323A in combination form electrical connection structures 330A over the magnetoresistor 317A, and the upper barrier layers 327B, the metal bulk layers 325B and the lower barrier layers 323B in combination form electrical connection structures 330B over the magnetoresistor 317B, in accordance with some embodiments.

The electrical connection structure 330A (or 330B) is used to change the current direction flowing through the magnetoresistor 317A (or 317B) between the electrical connection structures 330A (or 330B), such that the magnetoresistance value of the magnetoresistor 317A (or 317B) is linear in response to the applied magnetic field, in accordance with some embodiments. An angle between an extending direction of the electrical connection structures 330A, 330B and an extending direction of the magnetoresistors 317A, 317B may be about 45 degrees, in accordance with some embodiments. The electrical connection structures 330A, 330B laterally extend beyond the outer side surfaces of the stress release structures 321A, 321B facing away from the magnetoresistors 317A, 317B, in accordance with some embodiments. That is, the electrical connection structures 330A, 330B partially cover the outer side surfaces of the stress release structures 321A, 321B.

In accordance with some embodiments of the present disclosure, the stress applied to the magnetoresistors 317A, 317B can be released by forming the stress release structures 321A, 321B covering the side surfaces of the magnetoresistors 317A, 317B, thereby preventing the patterns of the magnetoresistors 317A, 317B from cracking locally at the edge. As a result, during the wet etching process 1200, the peeling problem of the patterns of the magnetoresistors from the edge as described above in FIGS. 1A-1D can be prevented.

A passivation layer 332 is formed to cover the dielectric layer 310 and the electrical connection structures 330A, 330B, as shown in FIGS. 3I-1 and 3I-2, in accordance with some embodiments. Next, an opening 334 is formed through the passivation layer 332 to expose the upper surface of the upper barrier layer 327A of the electrical connection structure 330A, thereby producing a magnetoresistive device 300, in accordance with some embodiments. In some embodiments, the passivation layer 330 includes or be silicon oxide, silicon nitride, silicon oxynitride, or a combination thereof. In some embodiments, the passivation layer 330 is formed using CVD.

Because no tantalum-containing adhesion layer is formed between the magnetoresistors 317A, 317B and the dielectric layer 310, CVD for forming the passivation layer 332 may be performed at a high temperature, e.g. in a range from about 400° C. to about 450° C., in accordance with some embodiments. Forming the passivation layer 332 by a high-temperature CVD results in not only a high deposition rate and a better thickness uniformity, but a lower undesirable particle performance, which enhances the manufacturing efficiency and production yield of the magnetoresistive device.

Furthermore, after the opening 334 is formed in the passivation layer 332, a high-temperature anneal may be performed on the magnetoresistive device 300, for example, at a temperature ranging from about 350° C. to about 450° C. to improve the performance of the magnetoresistors 317A, 317B, such as by increasing the magnetoresistance ratio (MR %) and reducing the sheet resistance (Rsq).

Figures 1, 2, 4A:
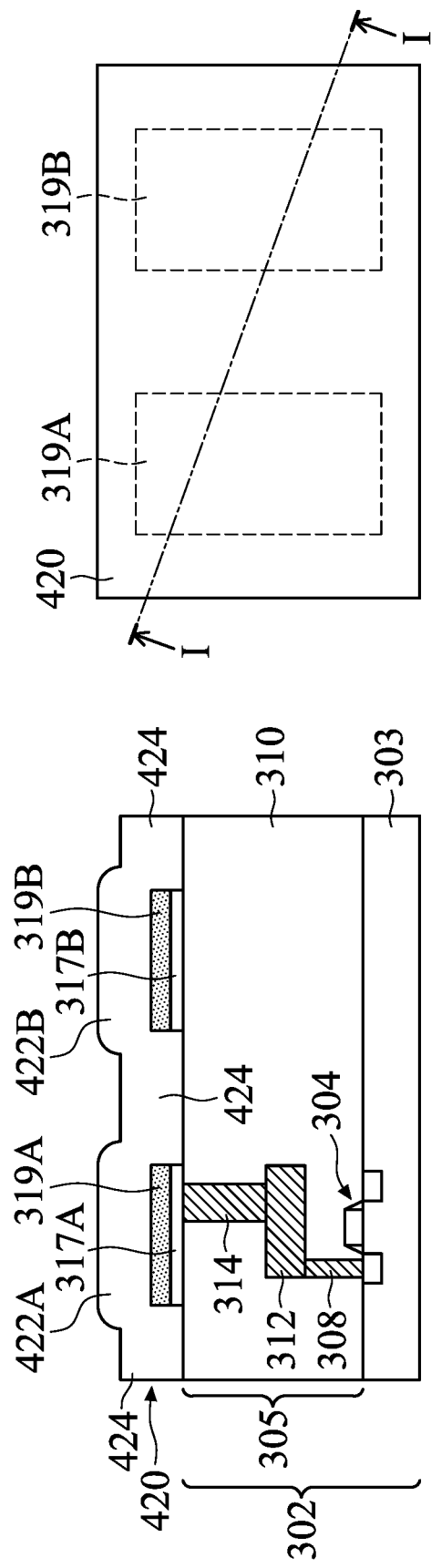
Figures 1, 2, 4B:
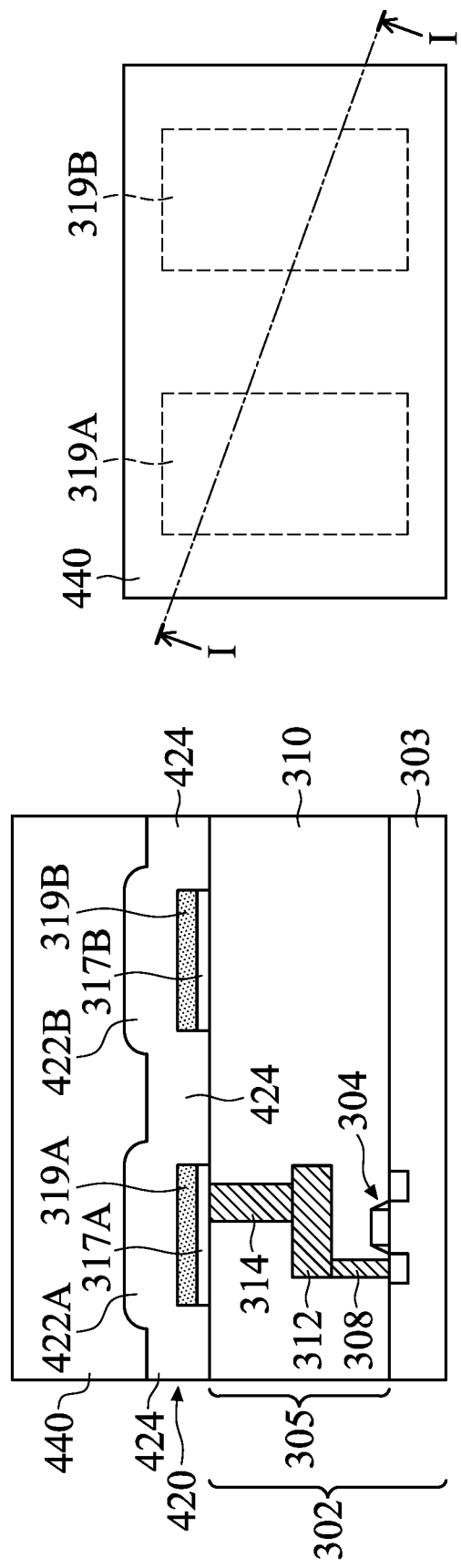
Figures 2, 4C:
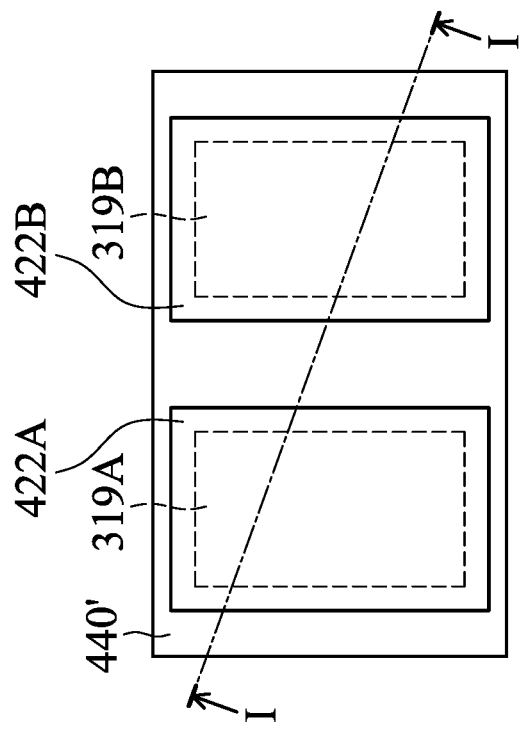
Figures 1, 4C:
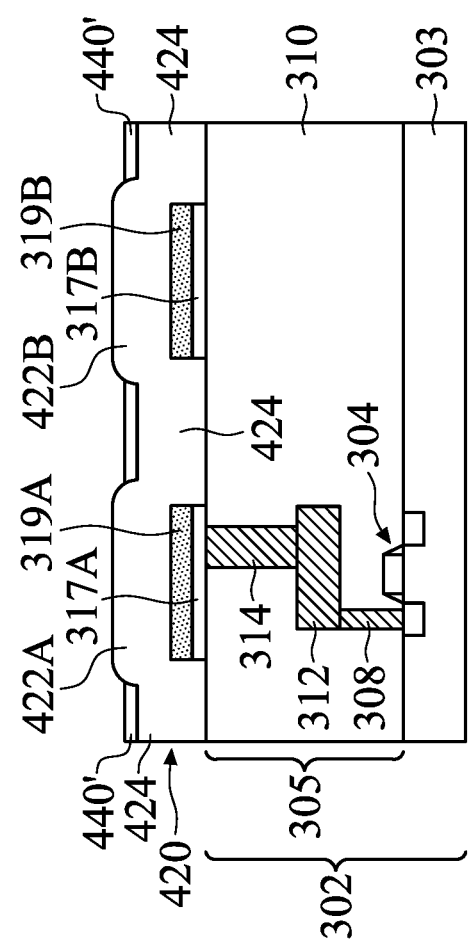
Figures 2, 4D:
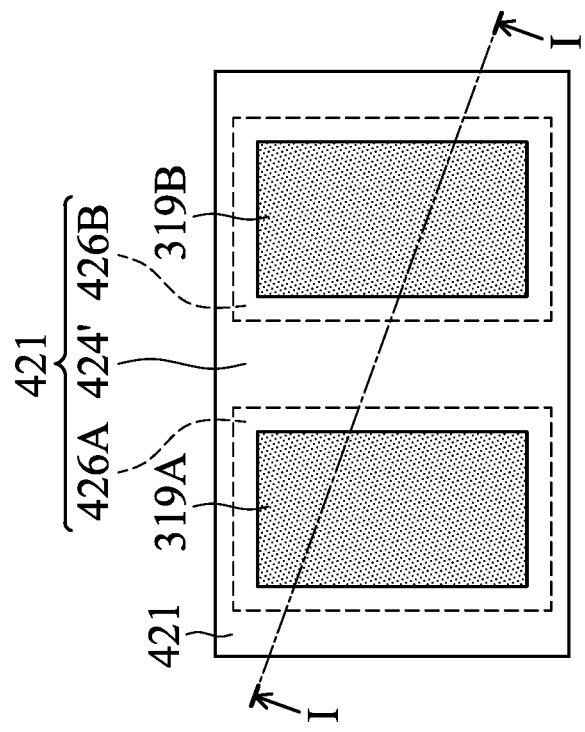
Figures 1, 4D:
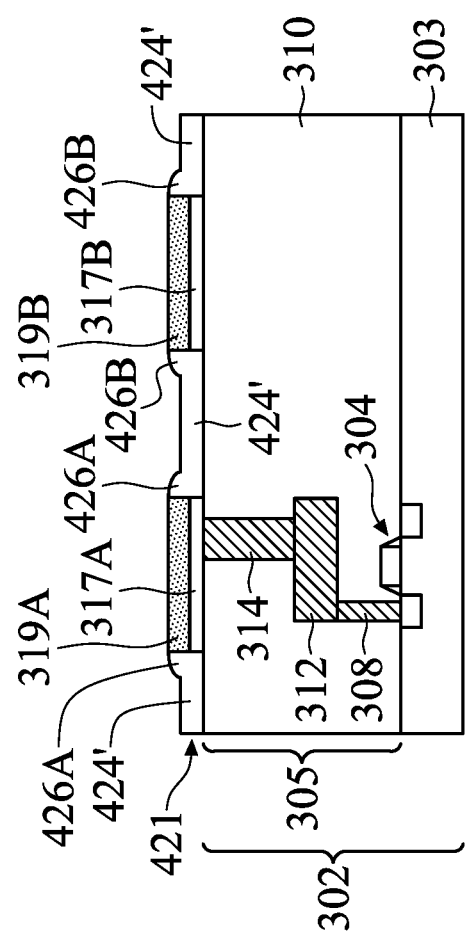
Figures 2, 4G:
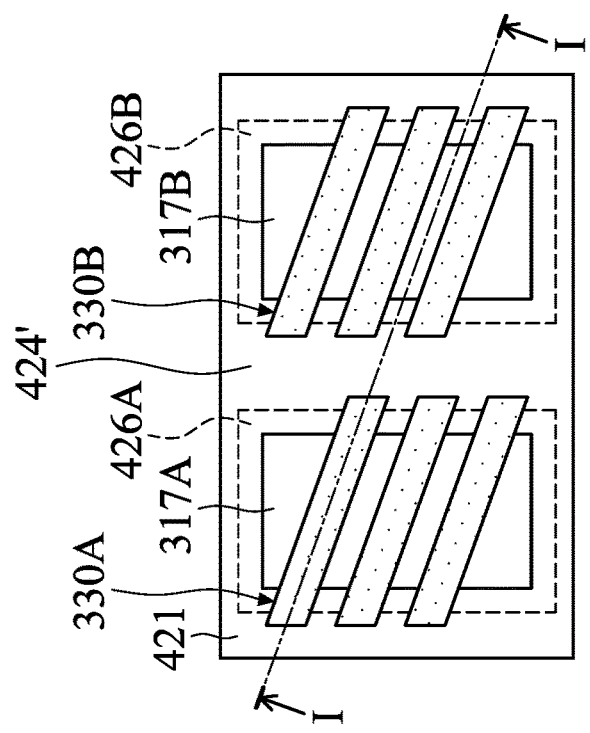
Figures 1, 4G:
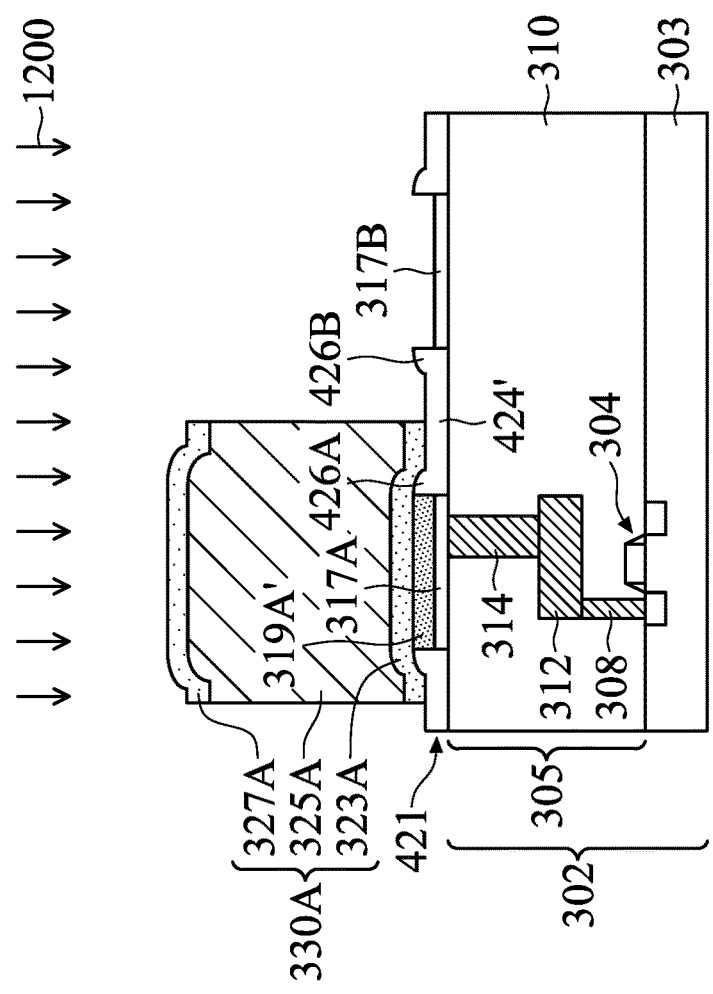
Figures 1, 2, 4H:
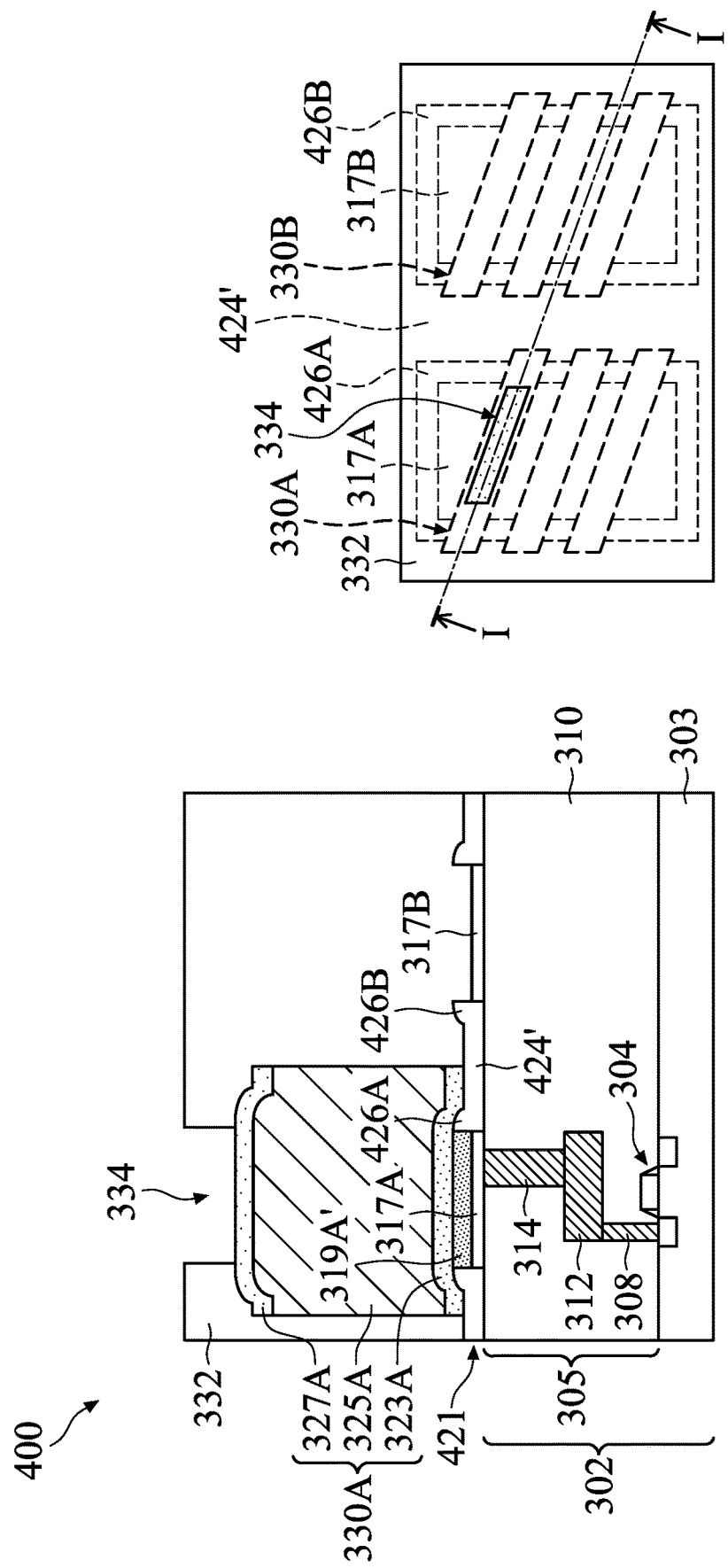

FIGS. 4A-1 to 4H-1 illustrate cross-sectional views of forming a magnetoresistive device including a stress release structure at intermediate steps in accordance with some embodiments of the present disclosure, and FIGS. 4A-2 to 4H-2 illustrate top views of forming the magnetoresistive device at intermediate steps in accordance with some embodiments of the present disclosure, wherein FIGS. 4A-1 to 4H-1 are cross-sectional views taken along line I-I shown in FIGS. 4A-2 to 4H-2 respectively.

The magnetoresistive device of the embodiments shown in FIGS. 4A-1 to 4H-2 is similar to that shown in FIGS. 3A-1 to 3I-2 except for a stress release structure. Elements or layers in FIGS. 4A-1 to 4H-2 that are the same or similar to those in FIGS. 3A-1 to 3I-2 are denoted by like reference numerals that have the same meaning, and the description thereof will not be repeated for the sake of brevity.

After forming the protection layers 319A, 319B and the magnetoresistors 317A, 317B, a dielectric material 420 is formed over the substrate 302, the magnetoresistors 317A, 317B and the protection layers 319A, 319B, as shown in FIGS. 4A-1 and 4A-2, in accordance with some embodiments. In some embodiments, the dielectric material 420 includes or is silicon oxide, silicon nitride, silicon oxynitride, a combination thereof, or another suitable dielectric material. In some embodiments, the dielectric material 420 is formed using CVD (such as low-temperature CVD), PVD, ALD, or another suitable deposition technique. In some embodiments, the dielectric material 420 has a thickness ranging from about 500 to Å about 5000 Å.

The dielectric material 420 includes flat portions 424 extending over the dielectric layer 310 and protruding portions 422A, 422B corresponding and covering the magnetoresistors 317A, 317B, in accordance with some embodiments. The protruding portions 422A, 422B protrude over the flat portions 424, in accordance with some embodiments.

A photoresist material 440 is globally formed over the dielectric material 420, as shown in FIGS. 4B-1 and 4B-2, in accordance with some embodiments.

The photoresist material 440 is etched back until the protruding portions 422A, 422B of the dielectric material 420 are exposed, as shown in FIGS. 4C-1 and 4C-2, in accordance with some embodiments. After the etching-back process, portions of the photoresist material 440 remain on the flat portions 424 of the dielectric material 420 and are referred to as photoresist material 440', in accordance with some embodiments.

An etching process is performed on the dielectric material 420 and the photoresist material 440' until the upper surfaces of the protection layers 319A, 319B are exposed, as shown in FIGS. 4D-1 and 4D-2, in accordance with some embodiments. After the etching process, remaining portions of the dielectric material 420 form a stress release structure 421, in accordance with some embodiments. In some embodiments, the etching process is IBE, RIE, or another suitable etching technique.

During the etching process, the photoresist material 440' are completely consumed, in accordance with some embodiments. Because of an etching selectivity between the dielectric material 420 and the photoresist material 440', the flat portions 424 of the dielectric material 420 remain on the upper surface of the dielectric layer 310 thereby forming flat portions 424' of the stress release structure 421, in accordance with some embodiments. Furthermore, the etching process removes the protruding portions 424A, 424B above the protection layers 319A, 319B thereby forming protruding portions 426A, 426B of the stress release structure 421, in accordance with some embodiments.

The protruding portions 426A, 426B protrude over the flat portions 424', in accordance with some embodiments. The protruding portions 426A, 426B each laterally extend in a closed loop to surround the side surfaces of the magnetoresistors 317A, 317B, respectively, in accordance with some embodiments. The protruding portions 426A, 426B entirely cover the side surfaces of the magnetoresistors 317A, 317B, in accordance with some embodiments. That is, the protruding portions 426A, 426B upwardly extend beyond the upper surfaces of the magnetoresistors 317A, 317B to cover at least partially the side surfaces of the protection layers 319A, 319B. Inner side surfaces of the protruding portions 426A, 426B facing the magnetoresistors 317A, 317B abut the magnetoresistors 317A, 317B and the protection layers 319A, 319B, in accordance with some embodiments. The flat portions 424 extend between the protruding portion 426A and the protruding portion 426B over the dielectric layer 310, in accordance with some embodiments.

A first barrier material 322, a metal bulk material 324 and the second barrier material 326 are formed sequentially over the stress release structure 421 and the protection layers 319A, 319B, as shown in FIGS. 4E-1 and 4E-2, in accordance with some embodiments.

The patterning process 1000 as described previously with respect to FIGS. 3F-1 to 3G-2 is performed on the second barrier material 326 and the metal bulk material 324 to form upper barrier layers 327A, 327B and metal bulk layer 325A, 325B respectively, as shown in FIGS. 4F-1 and 4F-2, wherein The metal bulk layer 325B is not shown in FIGS. 4F-1 and 4F-2, in accordance with some embodiments. After the ashing process of the patterning process 1000, the upper barrier layers 327A, 327B are exposed, in accordance with some embodiments.

The wet etching process 1200 as described previously with respect to FIGS. 3H-1 to 3H-2 is performed on the first barrier material 322 and the protection layers 319A, 319B using the metal bulk layers 325A, 325B as etching masks until the upper surfaces of the magnetoresistors 317A, 317B and the upper surface of the stress release structure 421 are exposed, as shown in FIGS. 4G-1 and 4G-2, in accordance with some embodiments. The inner side surfaces of the protruding portions 426A, 426B of the stress release structure 421 facing the magnetoresistors 317A, 317B are also partially exposed, in accordance with some embodiments.

After the wet etching process 1200, remaining portions of the first barrier material 322 are referred to as lower barrier layers 323A, 323B, and remaining portions of the protection layers 319A, 319B are referred to as protection layers 319A', 319B', wherein the lower barrier layer 323B and the protection layer 319B' are not shown in FIGS. 4G-1 and 4G-2, in accordance with some embodiments. The upper barrier layers 327A, the metal bulk layers 325A and the lower barrier layers 323A in combination form electrical connection structures 330A over the magnetoresistor 317A, and the upper barrier layers 327B, the metal bulk layers 325B and the lower barrier layers 323B in combination form electrical connection structures 330B over the magnetoresistor 317B, in accordance with some embodiments. The electrical connection structures 330A, 330B laterally extend beyond the outer side surfaces of the protruding portions 426A, 426B of the stress release structure 421 and partially cover the upper surfaces of the flat portions 424' of the stress release structure 421, in accordance with some embodiments.

In accordance with some embodiments of the present disclosure, the protruding portions 426A, 426B of the stress release structure 421 can release the stress applied to the magnetoresistors 317A, 317B by covering the interface between the magnetoresistor and the protection layer at the edge, thereby preventing the patterns of the magnetoresistors 317A, 317B from cracking locally at the edge. As a result, during the wet etching process 1200, the peeling problem of the patterns of the magnetoresistors from the edge as described above in FIGS. 1A-1D can be prevented.

A passivation layer 332 is formed to cover the substrate 302 and the electrical connection structures 330A, 330B, as shown in FIGS. 4H-1 and 4H-2, in accordance with some embodiments. Next, an opening 334 is formed through the passivation layer 332 to expose the upper surface of the upper barrier layer 327A of the electrical connection structure 330A, thereby producing a magnetoresistive device 400, in accordance with some embodiments.

Figure 5B:
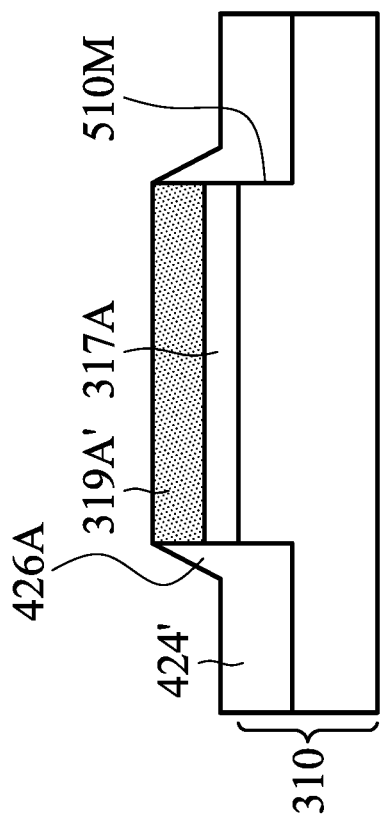
FIGS. 5A and 5B are portions of magnetoresistive devices to illustrate more details of the stress release structure in accordance with some embodiments of the present disclosure.
Figure 5A:
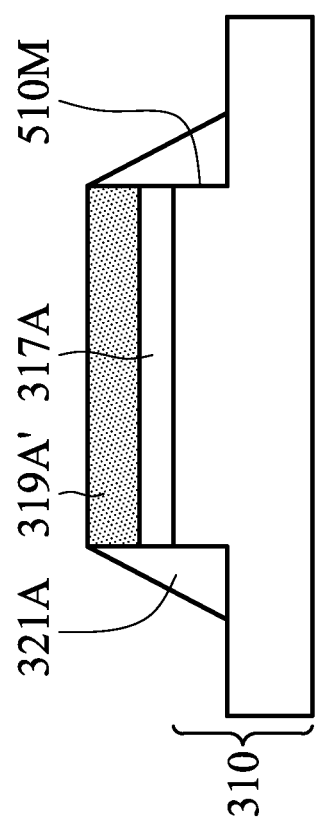

FIGS. 5A and 5B are portions of the magnetoresistive devices to illustrate the stress release structure in more detail, in accordance with some embodiments of the present disclosure.

In order to completely remove the portions of magnetoresistive material 316 uncovered by the mask elements, the etching process for forming the magnetoresistors 317A, 317B (FIG. 3B-1) further recesses the dielectric layer 310 of the substrate 302, thereby forming a mesa 510M, as shown in FIGS. 5A and 5B, in accordance with some embodiments. The stress release structure 321A (or 321B) covers and surrounds the side surfaces of the mesa 510M, as shown in FIG. 5A, in accordance with some embodiments. The protruding portion 426A (or 426B) of the stress release structure 421 covers and surrounds the side surfaces of the mesa 510M, as shown in FIG. 5B, in accordance with some embodiments.

As described above, the stress applied to a magnetoresistor can be released by forming a stress release structure covering a side surface of the magnetoresistor, in accordance with some embodiments. As a result, the pattern of the magnetoresistor at the edge can be prevented from cracking. This, in turn, prevents the pattern of the magnetoresistor from peeling off of the edge. Therefore, the manufacturing efficiency and production yield of the magnetoresistive device may be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive device, comprising:
    a magnetoresistor disposed over a substrate;
    a stress release structure covering a side surface of the magnetoresistor;
    an electrical connection structure disposed over the magnetoresistor; and
    a passivation layer disposed over the electrical connection structure and the stress release structure,
    wherein the electrical connection structure comprises:
        a lower barrier layer, a metal bulk layer and an upper barrier layer sequentially stacked over the magnetoresistor.

2. The magnetoresistive device as claimed in claim 1, wherein an inner side surface of the stress release structure facing the magnetoresistor extends upwardly beyond an upper surface of the magnetoresistor.

3. The magnetoresistive device as claimed in claim 1, wherein the electrical connection structure covers an outer side surface of the stress release structure facing away from the magnetoresistor.

4. The magnetoresistive device as claimed in claim 1, wherein the stress release structure surrounds the magnetoresistor in a closed loop.

5. The magnetoresistive device as claimed in claim 1, wherein the stress release structure comprises:
    a flat portion extending over a dielectric layer of the substrate; and
    a protruding portion protruding over the flat portion and abutting the magnetoresistor.

6. The magnetoresistive device as claimed in claim 1, further comprising:
    a protection layer disposed between the magnetoresistor and the lower barrier layer.

7. The magnetoresistive device as claimed in claim 6, wherein a side surface of the protection layer is aligned with the side surface of the magnetoresistor.

8. The magnetoresistive device as claimed in claim 7, wherein the stress release structure at least partially covers the side surface of the magnetoresistor.

9. The magnetoresistive device as claimed in claim 6, wherein the protection layer is made of titanium tungsten.

10. The magnetoresistive device as claimed in claim 1, wherein the stress release structure is made of silicon oxide, silicon nitride or silicon oxynitride.

11. The magnetoresistive device as claimed in claim 1, wherein the substrate comprises a mesa and the stress release structure surrounds the mesa.

12. A method for forming a magnetoresistive device, comprising:
    forming a magnetoresistor over a substrate;
    forming a dielectric material over the magnetoresistor;
    etching the dielectric material to form a stress release structure surrounding a side surface of the magnetoresistor;
    forming an electrical connection structure over the magnetoresistor; and
    forming a passivation layer covering the electrical connection structure and the stress release structure,
    wherein the electrical connection structure comprises:
        a lower barrier layer, a metal bulk layer and an upper barrier layer sequentially stacked over the magnetoresistor.

13. The method as claimed in claim 12, wherein:
the dielectric material is etched until an upper surface of the substrate is exposed;
the electrical connection structure extends laterally beyond an outer side surface of the stress release structure facing away from the magnetoresistor.

14. The method as claimed in claim 12, wherein the dielectric material comprises:
a flat portion extending over the substrate; and
a protruding portion protruding over the flat portion and covering the magnetoresistor.

15. A method for forming a magnetoresistive device, comprising:
forming a magnetoresistor over a substrate;
forming a dielectric material over the magnetoresistor, wherein the dielectric material comprises:
a flat portion extending over the substrate; and
a protruding portion protruding over the flat portion and covering the magnetoresistor,
forming a photoresist material over the dielectric material;
etching back the photoresist material thereby exposing the protruding portion of the dielectric material and leaving the photoresist material over the flat portion of the dielectric material;
etching the dielectric material to form a stress release structure surrounding a side surface of the magnetoresistor, wherein the flat portion of the dielectric material remains on the substrate after etching the dielectric material;
forming an electrical connection structure over the magnetoresistor; and
forming a passivation layer covering the electrical connection structure and the stress release structure.

16. The method as claimed in claim 12, wherein forming the magnetoresistor comprises:
forming a magnetoresistive material over the substrate;
forming a protection material over the magnetoresistive material; and
performing a first patterning process on the protection material and the magnetoresistive material to form a protection layer and the magnetoresistor respectively.

17. The method as claimed in claim 16, wherein forming the electrical connection structure comprises:
depositing a first barrier material over the protection layer and the stress release structure;
depositing a metal bulk material over the first barrier material;
depositing a second barrier material over the metal bulk material;
performing a second patterning process on the second barrier material and the metal bulk material to form the upper barrier layer and the metal bulk layer respectively; and
performing a wet etching process on the first barrier material using the metal bulk layer as an etching mask to form the lower barrier layer.

18. The method as claimed in claim 17, wherein the wet etching process removes portions of the protection layer thereby exposing an inner side surface of the stress release structure facing the magnetoresistor.

19. The method as claimed in claim 16, wherein the first patterning process comprises:
patterning a dielectric layer of the substrate to form a mesa, wherein the stress release structure covers a side surface of the mesa.

* * * * *